(12) United States Patent
Dungan

(10) Patent No.: US 11,721,685 B2
(45) Date of Patent: Aug. 8, 2023

(54) COPPER-BONDED MEMORY STACKS WITH COPPER-BONDED INTERCONNECTION MEMORY SYSTEMS

(71) Applicant: AVAGO TECHNOLOGIES INTERNATIONAL SALES PTE. LIMITED, Singapore (SG)

(72) Inventor: Thomas Edward Dungan, Fort Collins, CO (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 70 days.

(21) Appl. No.: 17/331,196

(22) Filed: May 26, 2021

(65) Prior Publication Data

US 2022/0384407 A1 Dec. 1, 2022

(51) Int. Cl.
| | |
|---|---|
| *H01L 25/18* | (2023.01) |
| *H01L 23/367* | (2006.01) |
| *H01L 23/48* | (2006.01) |
| *H01L 23/538* | (2006.01) |
| *H01L 23/00* | (2006.01) |
| *H01L 25/065* | (2023.01) |
| *H01L 25/00* | (2006.01) |

(52) U.S. Cl.
CPC ............ *H01L 25/18* (2013.01); *H01L 23/367* (2013.01); *H01L 23/481* (2013.01); *H01L 23/5381* (2013.01); *H01L 24/05* (2013.01); *H01L 24/08* (2013.01); *H01L 24/80* (2013.01); *H01L 25/0652* (2013.01); *H01L 25/50* (2013.01); *H01L 2224/05147* (2013.01); *H01L 2224/08145* (2013.01); *H01L 2224/80895* (2013.01); *H01L 2225/06517* (2013.01); *H01L 2225/06541* (2013.01); *H01L 2225/06589* (2013.01); *H01L 2924/1431* (2013.01); *H01L 2924/1436* (2013.01)

(58) Field of Classification Search
CPC ............. H01L 23/5381; H01L 25/0652; H01L 2924/1431; H01L 2924/1436; H01L 2224/05147
See application file for complete search history.

(56) References Cited

U.S. PATENT DOCUMENTS

| | | | | |
|---|---|---|---|---|
| 10,770,430 | B1* | 9/2020 | Kim | H01L 25/50 |
| 10,784,202 | B2* | 9/2020 | Arguin | H01L 23/49827 |
| 11,367,705 | B2* | 6/2022 | Beyne | H01L 25/0652 |
| 11,373,989 | B1* | 6/2022 | Gandhi | H01L 25/50 |
| 2012/0106117 | A1* | 5/2012 | Sundaram | H01L 25/18 |
| | | | | 257/772 |

(Continued)

FOREIGN PATENT DOCUMENTS

DE 102020130849 A1 * 8/2021 ........... H01L 23/367

OTHER PUBLICATIONS

Extended European Search Report from European Patent Application No. 22175023.5, dated Oct. 20, 2022, 10 pages.

*Primary Examiner* — Mamadou L Diallo
(74) *Attorney, Agent, or Firm* — Foley & Lardner LLP

(57) ABSTRACT

A memory system includes a memory stack including a number of memory dies interconnected via copper bonding, a logic die coupled to the memory stack via a copper bonding. The memory system further includes a buffer die extended to provide the copper bonding between the logic die and the memory stack and a silicon carrier layer bonded to the memory stack and the logic die.

20 Claims, 14 Drawing Sheets

(56) References Cited

U.S. PATENT DOCUMENTS

| | | | |
|---|---|---|---|
| 2013/0292840 A1* | 11/2013 | Shoemaker | H01L 27/108 257/773 |
| 2014/0001639 A1* | 1/2014 | Hiraishi | H01L 23/48 257/773 |
| 2014/0140156 A1* | 5/2014 | Shoemaker | G11C 11/40615 365/201 |
| 2014/0346671 A1* | 11/2014 | Yu | H01L 21/6836 257/737 |
| 2015/0155876 A1* | 6/2015 | Jayasena | G11C 7/1006 326/39 |
| 2016/0093597 A1 | 3/2016 | Chang et al. | |
| 2016/0118371 A1* | 4/2016 | Park | H01L 24/17 257/773 |
| 2018/0047704 A1 | 2/2018 | Haba | |
| 2018/0096735 A1* | 4/2018 | Pappu | G11C 29/14 |
| 2018/0130780 A1* | 5/2018 | Gonzales | H01L 23/5386 |
| 2018/0294249 A1* | 10/2018 | Watanabe | H01L 23/5389 |
| 2019/0279938 A1* | 9/2019 | Mehta | H01L 21/78 |
| 2020/0006241 A1* | 1/2020 | Wu | H01L 21/565 |
| 2020/0013754 A1 | 1/2020 | Gao et al. | |
| 2020/0328184 A1 | 10/2020 | Takishita et al. | |
| 2020/0357746 A1 | 11/2020 | Koshikawa et al. | |
| 2021/0225809 A1* | 7/2021 | Yu | H01L 25/0657 |
| 2021/0242170 A1* | 8/2021 | Dabral | H01L 23/5386 |
| 2021/0305226 A1* | 9/2021 | Tsai | H01L 25/0657 |
| 2022/0013445 A1* | 1/2022 | Kim | H01L 23/49838 |
| 2022/0030185 A1* | 1/2022 | Honda | H04N 5/3454 |
| 2022/0059505 A1* | 2/2022 | Song | H01L 25/50 |
| 2022/0093415 A1* | 3/2022 | Lin | H01L 24/80 |
| 2022/0189916 A1* | 6/2022 | Jung | H01L 23/5385 |

\* cited by examiner

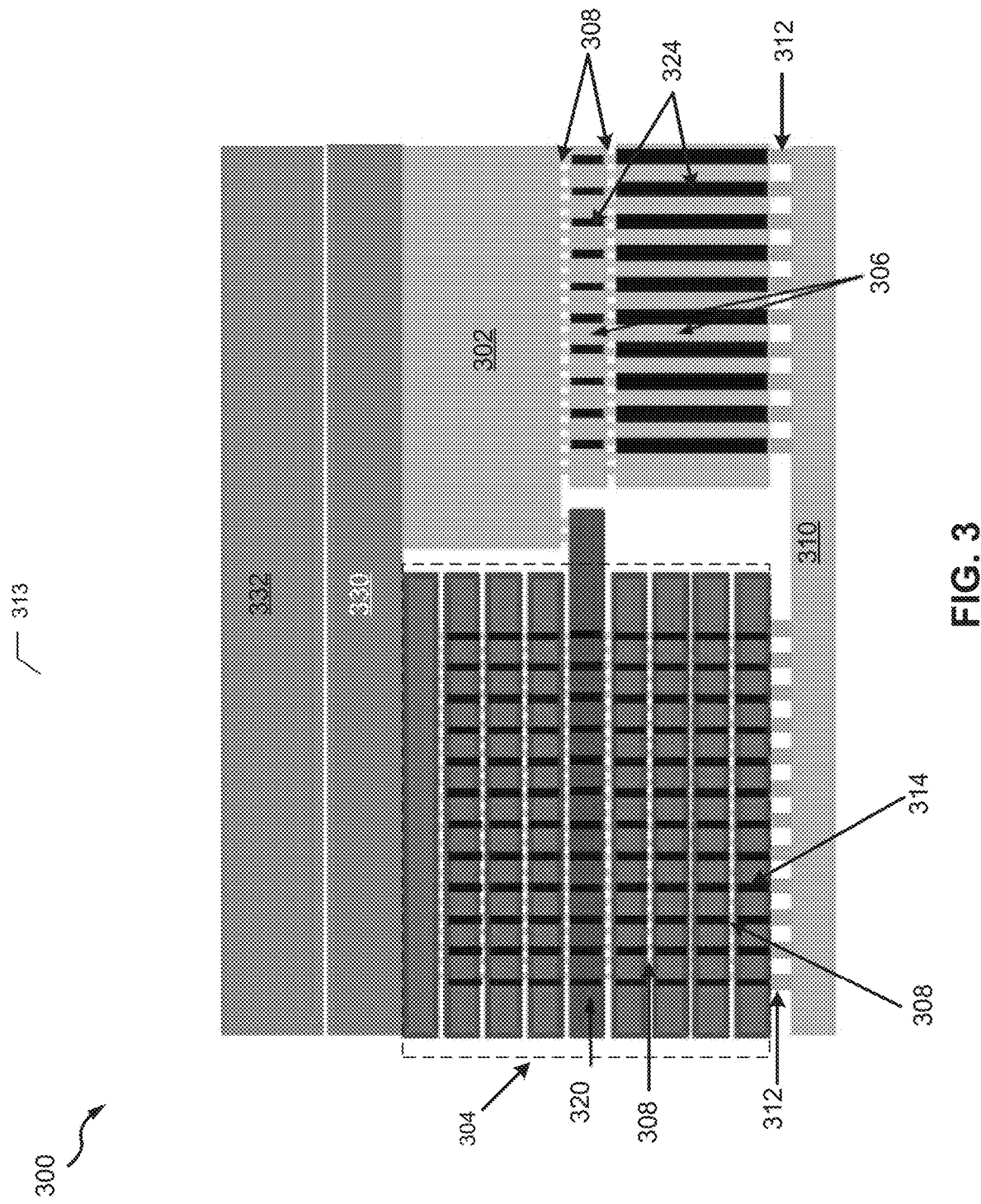

ns. The focus here is on the interconnection portion of this, from the HBM stack to the logic die (while DRAM-to-DRAM stack connections are also improved by copper bonding).

COPPER-BONDED MEMORY STACKS WITH COPPER-BONDED INTERCONNECTION MEMORY SYSTEMS

TECHNICAL FIELD

The present description relates generally to integrated circuits and, in particular, to copper-bonded memory stacks with copper-bonded interconnection memory systems.

BACKGROUND

High-bandwidth memory (HBM) is widely used to provide a large-capacity memory with high-bandwidth interconnection to a processing logic die in an integrated module for high-performance computing, artificial intelligence, machine learning and other applications. Conventional HBM is implemented with several layers of dynamic random-access memory (DRAM) die stacked on a buffer die using solder microbump interconnections. Direct copper bonding (hybrid copper bonding or copper-fusion bonding, hereafter referred to as "copper bonding") can provide much denser interconnection pitch compared to solder microbumps, while also reducing the thermal resistance and parasitic electrical impedance between the bonded die.

Replacing the solder microbumps with copper bonding has the potential to significantly increase the practical stacking limit in HBM stacks. For example, present solder-bonded maximum stack height is perhaps 12 layers. However, with copper bonding 24 or 32 layers might be stacked with thinner silicon per layer, lower thermal resistance, and higher bonding yields. As copper bonding is used to increase the maximum capacity in HBM stacks, a memory structure is needed to use copper bonding to also increase the interconnection bandwidth between HBM stacks and logic die.

BRIEF DESCRIPTION OF THE DRAWINGS

Certain features of the subject technology are set forth in the appended claims. However, for purposes of explanation, several embodiments of the subject technology are set forth in the following figures.

FIG. 3 is a schematic diagram illustrating an example of a memory system including an HBM stack with a middle overlapping buffer-die connection, according to various aspects of the subject technology.

DETAILED DESCRIPTION

Figure 1:
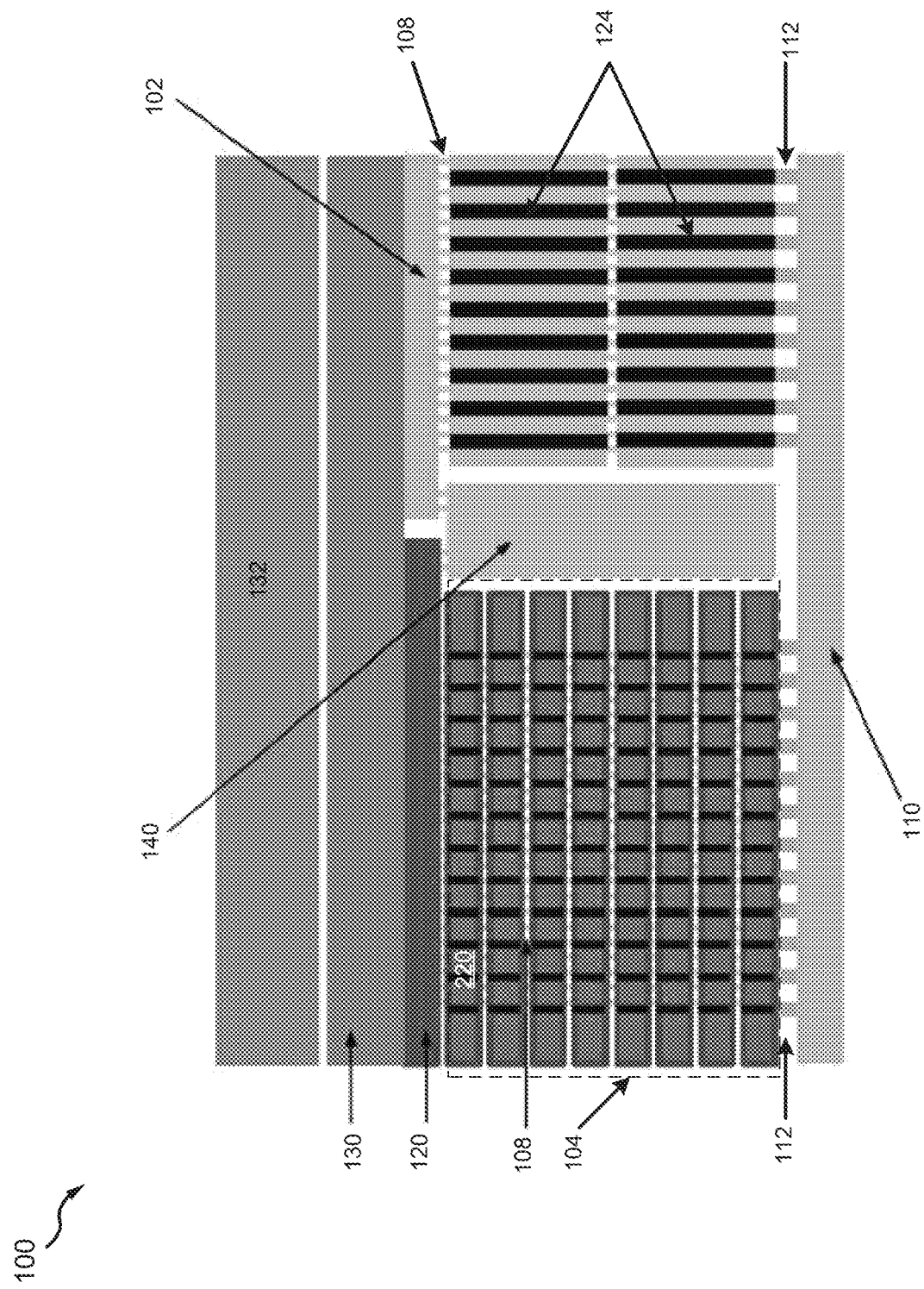
FIG. 1 is a schematic diagram illustrating an example of a memory system including a hybrid copper-bonded (HCB) bridge-connected memory stack, according to various aspects of the subject technology.

The detailed description set forth below is intended as a description of various configurations of the subject technology and is not intended to represent the only configurations in which the subject technology may be practiced. The appended drawings are incorporated herein and constitute part of the detailed description, which includes specific details for providing a thorough understanding of the subject technology. However, the subject technology is not limited to the specific details set forth herein and may be practiced without one or more of the specific details. In some instances, structures and components are shown in a block-diagram form in order to avoid obscuring the concepts of the subject technology.

The subject technology is directed to memory systems and systems for copper-bonded memory stacks with copper-bonded interconnection memory systems. The disclosed invention defines three different physical configurations for replacing the solder microbump and interposer and/or package connection from the HBM to the logic die with copper-bonded connections, along with process sequences for assembly of the proposed copper-bonded HBMs with copper-bonded connections to logic die. The copper-bonded interconnection memory systems of the subject technology increase the interconnection bandwidth between high-bandwidth-memory (HBM) stacks and logic die. Conventional HBM achieves high-bandwidth interconnection relative to other conventional memories through a wider connection to the logic die, i.e., a connection with a larger number of data wires. In the case of traditional HBM memory, the width of the interface is 1,024 data wires (compared to 64 data wires in other conventional memories, for example). Memory stacks with copper-bonded interconnect can significantly increase the number of data wires, and thus the interconnection bandwidth, compared to conventional solder-bonded HBMs. The increased data-wire capacity comes from decreased copper-bonded connection pitch compared to solder microbump pitch.

A conventional HBM stack might use a 55 µm solder microbump pitch, while a copper-bonded memory stack might have a 9 µm connection pitch (or less), for a connection density multiplier of $55^2/9^2$ that is greater than 37 times. The increased interconnection density with copper bonding also allows much shorter link distances as the connection array area decreases drastically. In conventional HBMs, link wire lengths are typically several millimeters, while copper-bonded link lengths might be half a millimeter or less. Reduced link lengths and reduced parasitic capacitance, resistance, and inductance of copper-bonded connections also allow higher energy efficiency compared to a conventional solder-bonded HBM.

The increased interconnection bandwidth provided by copper-bonded interconnect is important to realizing the full potential benefit of copper-bonded dynamic random-access memory (DRAM) stacks. Copper-bonded stacks can potentially significantly increase memory-stack capacity by increasing the practical limits on the number of layers in the stack, due to improved thermal conductivity, improved bonding yield, and increased planarity and mechanical integrity supporting thinner individual DRAM silicon layers. But the value of the increasing total capacity of the copper-bonded DRAM stack may not be fully realized in system functionality if the interconnection bandwidth does not also increase.

FIG. 1 is a schematic diagram illustrating an example memory system 100 including a hybrid copper-bonded (HCB) bridge-connected memory stack 104, according to various aspects of the subject technology. The memory system 100 includes the HCB bridge-connected memory stack 104 (hereinafter, memory stack 100), a logic die 102 (e.g., including data-processing circuitry), a memory stack 104 (e.g., DRAM stack), an interposer 110, a buffer die 120, a silicon carrier 130, a heat sink 132, and a passive bridge die 140. The memory stack 104 includes a number of memory dies that are interconnected via copper bonding 108. The memory stack 104 is connected to the interposer 110 via conductive microbumps 112. The logic die 102 is coupled to the interposed 110 via copper bonding 108, through-silicon vias (TSVs) 124 and the conductive microbumps 112. The passive bridge die 140 is copper bonded to the logic die 102 and the buffer die 120 and provides interconnections between the logic die 102 and the memory stack 104. The implementation of the passive bridge die 140 as a medium to facilitate coupling the logic die 102 and the buffer die 120 memory stack 104 through copper bonding 108 is an important feature of the subject technology that allows the data signals to pass through copper bonding rather than TSVs and microbumps. This can increase the interconnection bandwidth between the logic die 102 and the memory stack 104. It should be noted that the structural features shown in FIG. 1 are not drawn to the scale.

Figure 2:
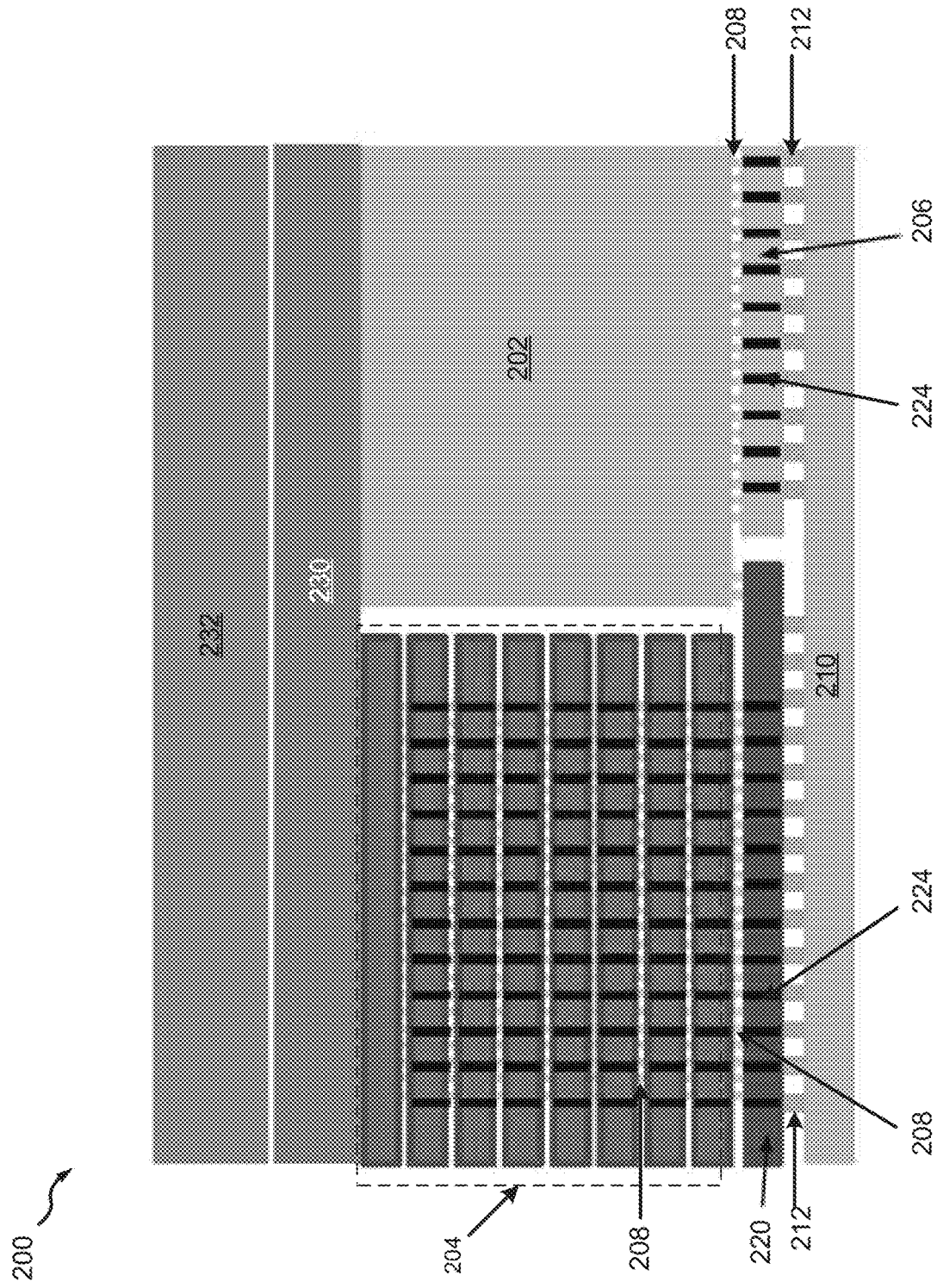
FIG. 2 is a schematic diagram illustrating an example of a memory system including a high-bandwidth memory (HBM) stack with a bottom overlapping buffer-die connection, according to various aspects of the subject technology.

FIG. 2 is a schematic diagram illustrating an example of a memory system 200 including an HBM stack 204 with a bottom overlapping buffer-die connection, according to various aspects of the subject technology. The memory system 200 includes the HBM stack 204 (e.g., DRAM stack), a logic die 202 (e.g., including data-processing circuitry), an interposer 210, a buffer die 220, a silicon carrier 230 and a heat sink 232. The HBM stack 204 includes a number of memory dies that are interconnected via copper bonding 208. The HBM stack 204 is connected to the interposer 210 via conductive microbumps 212. The logic die 202 is coupled to the interposer 210 via copper bonding 208, TSVs 224 passing through a support die 206, and the conductive microbumps 212. The buffer die 220 is extended toward the support dies die 206 and is connected to the logic die 202 via copper bonding 208. The buffer die 220 facilitates coupling the HBM stack 204 to the logic die 202 via copper bonding 208. The implementation of extension of the buffer die 220 as a medium to provide coupling between the logic die 202 and HBM stack 204 through copper bonding 208 is a significant feature of the present disclosure that allows the data signals to pass through copper bonding rather than TSVs and microbumps, which increases interconnection bandwidth between the logic die 202 and the HBM stack 204. The maximum data capacity is increased by the use of copper bonding within the layers of the stack, enabling a larger maximum number of layers through improved thermal conductance, mechanical integrity and electrical characteristics. The copper-bonded interconnection, through the bridge die in this case, may not increase the capacity, but it does allow the system to take full advantage of the increased capacity, which otherwise would be bottle-necked by the narrower conventional interface between the memory and the logic die. As described above, in the memory system 200, the buffer die 220 is on the bottom of the HBM stack 204 with buffer extended to overlap the logic die 202 (processor). The support die 206 depth on the logic die 202 is limited to exactly one level. It should be noted that the structural features shown in FIG. 2 are not drawn to the scale.

FIG. 3 is a schematic diagram illustrating an example of a memory system 300 including an HBM stack 304 with a middle overlapping buffer-die connection, according to various aspects of the subject technology. The memory system 300 includes the HBM stack 304 (e.g., DRAM stack), a logic die 302 (e.g., including data-processing circuitry), an interposer 310, a buffer die 320, a silicon carrier 330 and a heat sink 332. The HBM stack 304 includes a number of memory dies that are interconnected via copper bonding 308. The HBM stack 304 is connected to the interposer 310 via conductive microbumps 312. The logic die 302 is coupled to the interposer 210 via copper bonding 308, TSVs 324 passing through support dies 306, and conductive microbumps 312. The buffer die 320 is disposed in the middle of the HBM stack 304 and is extended toward the support dies 306 and is connected to the logic die 302 via copper bonding 308. The middle buffer die 320 facilitates coupling the HBM stack 304 to the logic die 302 via copper bonding 308. Therefore, the extension of the middle buffer die 320 as a medium to provide coupling between the logic die 302 and HBM stack 304 through copper bonding 308 is an important feature of the present disclosure and allows the data signals to pass through copper bonding rather than TSVs and microbumps, which increases the interconnection bandwidth between the logic die 302 and the HBM stack 304. In the memory system 300, the buffer die 320 is in the middle of the HBM stack 304 with the buffer die 320 extended to overlap the logic die 302 (processor). The support die 306 depth on logic die 302 is greater or equal to two levels. It should be noted that the structural features shown in FIG. 3 are not drawn to the scale.

Figure 4A:
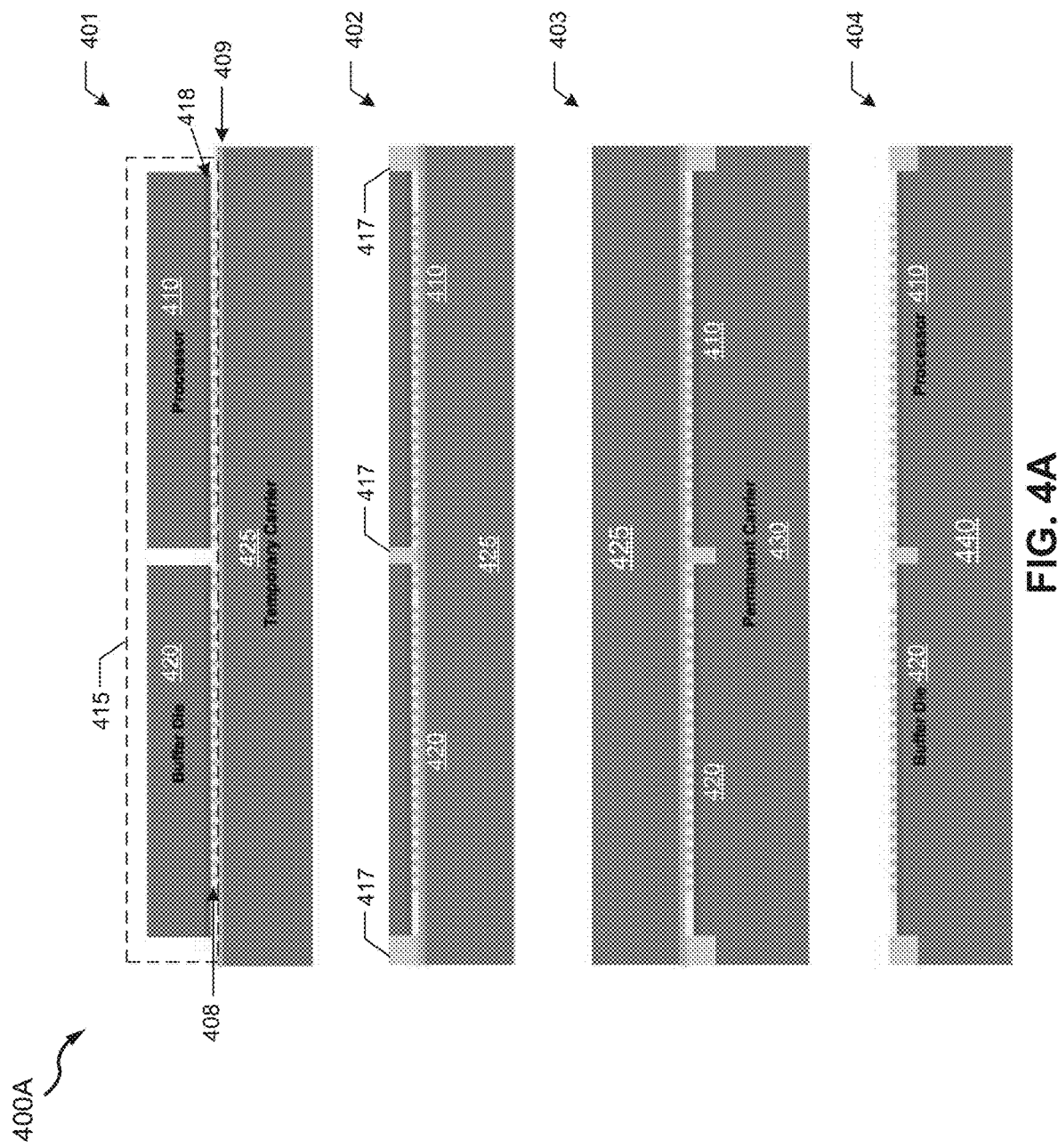
FIGS. 4A and 4B are diagrams illustrating an example of a process flow for fabricating an HBM dynamic random-access memory (DRAM) stack connected by a passive hybrid copper-bonded (HCB) bridge, according to various aspects of the subject technology.
Figure 4B:
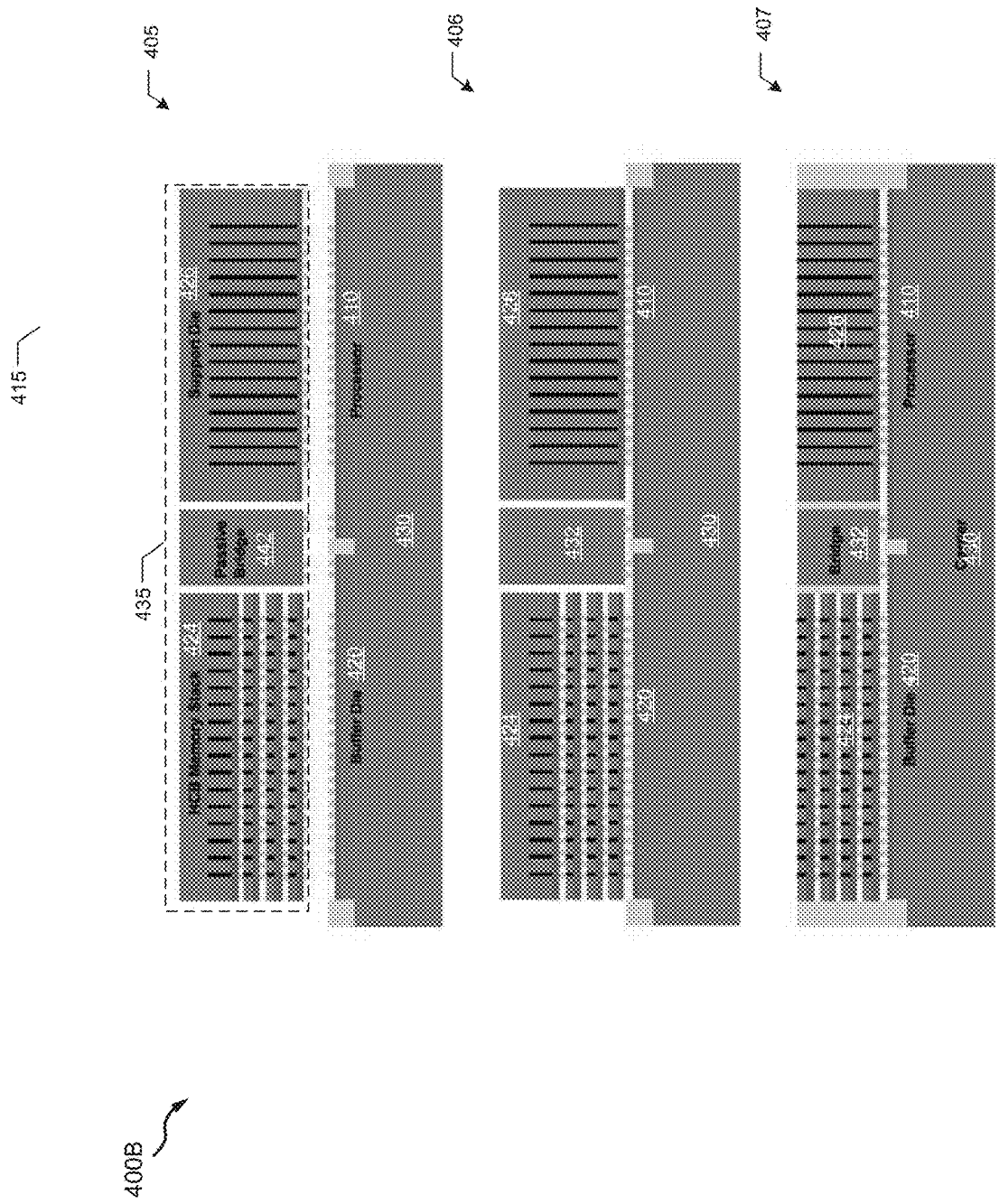

FIGS. 4A and 4B are diagrams illustrating an example of process flows 400A and 400B for fabricating an HBM dynamic DRAM stack connected by a passive HCB bridge, according to various aspects of the subject technology. The process flow 400A only shows major steps and skips descriptions of process flow for individual layers, which are well known. In process step 401, a structure 415 including a logic die 410 (e.g., including data-processing circuitry), a buffer die 420, with each of 410 and 420 including a copper bonding 408 and active layer 418 (including active elements such as transistors) are attached with face-down (i.e., with active surface 418 and copper bonding layer 408 oriented downward) on a temporary carrier 425, using temporary adhesive layer 409. These dies have been fabricated by normal wafer fabrication processes through the standard interconnect stack completion, followed by addition of the copper bonding layers 408, and singulation, prior to attach to the temporary carrier in the first drawing 401). In process step 402, fillers 417 (e.g., dielectric material) are deposited and the structure 415 (including the buffer die 420 and logic die 410 are) is thinned to a desired thickness. In process step 403, a silicon carrier layer 430 is permanently bonded to the in-process product of the process step 402, and the result is flipped so that the temporary carrier 425 can be removed in the next process step 404. It should be noted that what is described above with respect to processing a single die in practice applies ton entire wafer full of such dies that are processed simultaneously. Also, although the drawings only show one memory stack attached to the logic die, in actual use several memory stacks would be connected to each logic die, and various logic die might also themselves be interconnected to one another by copper-bonded bridge during the formation of the overall system.

The process flow 400B of FIG. 4B is the continuation of the process flow 400A and includes process steps 405, 406 and 407. In process step 405, the structure 435 including a HCB memory stack 424, a support die 426, a passive bridge 442 and corresponding active layers and copper bonding layers are prepared and face-to-face and die-to-wafer aligned with the in-process product of step 404 (e.g., reconstituted wafer) In process step 406, the memory stack 424, the passive bridge 442 and the support die 426 are copper bonded to the in-process product of step 404. In process step 407, the back surfaces of the attached die 424, 432, and 426 (structure 435), which are bonded to the in-process product of step 404, are machined (e.g., using chemical-mechanical polishing) to a desired thickness to reveal the TSVs. The structure is then completed by addition of solder microbumps or pillars and attaching of the interposer and heat sink (steps not shown) to produce the memory system 100 of FIG. 1.

Figure 5A:
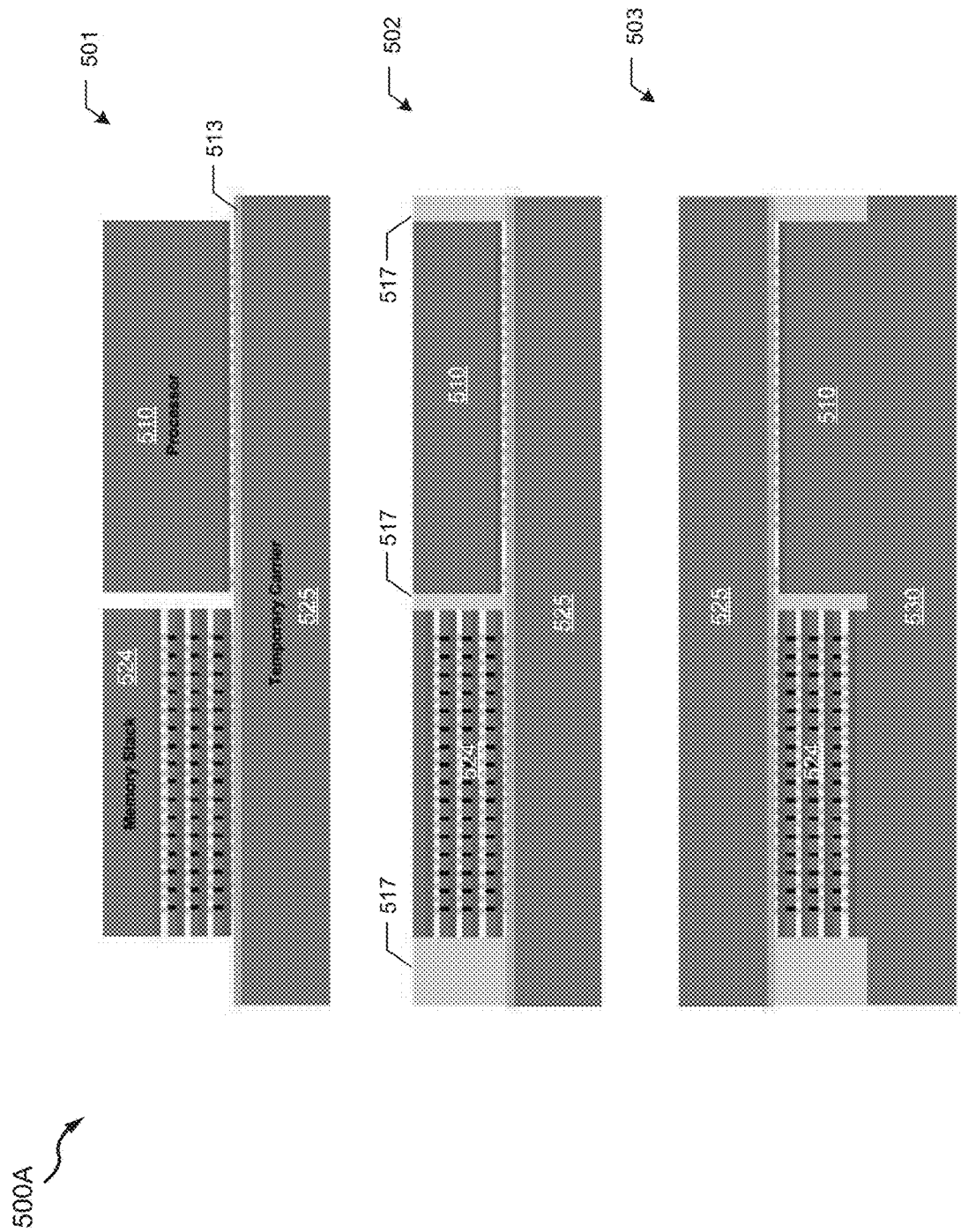
FIGS. 5A, 5B and 5C are diagrams illustrating an example of a process flow for fabricating an HCB DRAM stack with overlapping buffer at the bottom of the stack, according to various aspects of the subject technology.
Figure 5B:
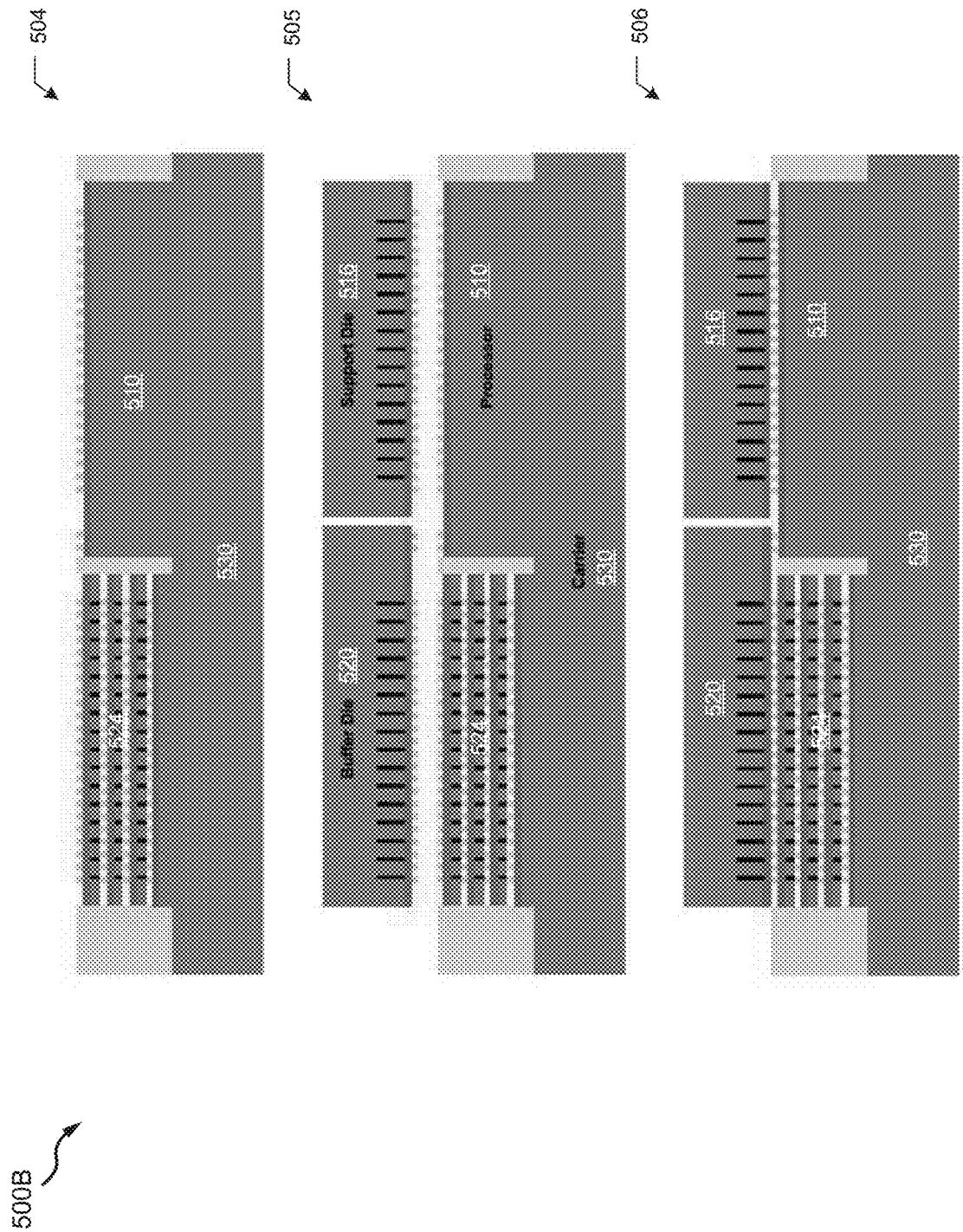
Figure 5C:
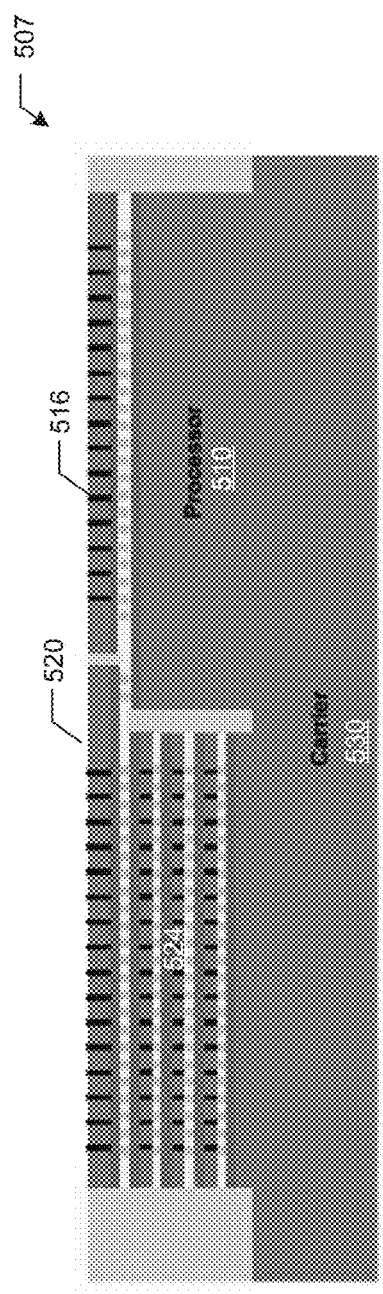

FIGS. 5A, 5B and 5C are diagrams illustrating an example of process flows 500A, 500B and 500C for fabricating an HCB DRAM stack with overlapping buffer at the bottom of the stack, according to various aspects of the subject technology. The process flow 500A only shows major steps and skips descriptions of process flow for individual layers, which are well known. In process step 501, a logic die (e.g., including a processor) 510 and a memory stack die 524 (e.g., the HCB DRAM stack) are mounted on a temporary carrier 525 using a temporary adhesive layer 513. In process step 502, fillers 517 (e.g., dielectric material) are deposited to fill gaps as shown in FIG. 5A. In process step 503, a silicon carrier wafer 530 is permanently bonded to the in-process product of the process step 502 and the result is flipped so that the temporary carrier 525 can be removed in a next process step 504 of FIG. 5B.

The process flow 500B of FIG. 5B is the continuation of the process flow 500A and includes process steps 504, 505 and 506 and 507. In process step 504, the temporary carrier 525 is removed so that the logic die 510 and the memory stack die 524 and corresponding copper bonding layers are exposed. In process step 505, a buffer die 520, a support die 516 and corresponding active layers and copper bonding layers are prepared and face-to-face and die-to-wafer aligned with the in-process product of step 504. In process step 506, the buffer die 520 and support die 516 of process step 505 is copper bonded to the already aligned in-process product of step 504.

FIG. 5C is the continuation of the process flow 500B and includes process step 507. In the process step 507, the buffer die 520 and support die 516, which are bonded to the in-process product of step 504, is machined (e.g., by chemical-mechanical polishing) to a desired thickness to produce part of the memory system 300 of FIG. 3 (e.g., the logic die 302, a top portion of memory stack 304, the buffer dies 320, the support die 308 and the silicon carrier 330).

Figure 6A:
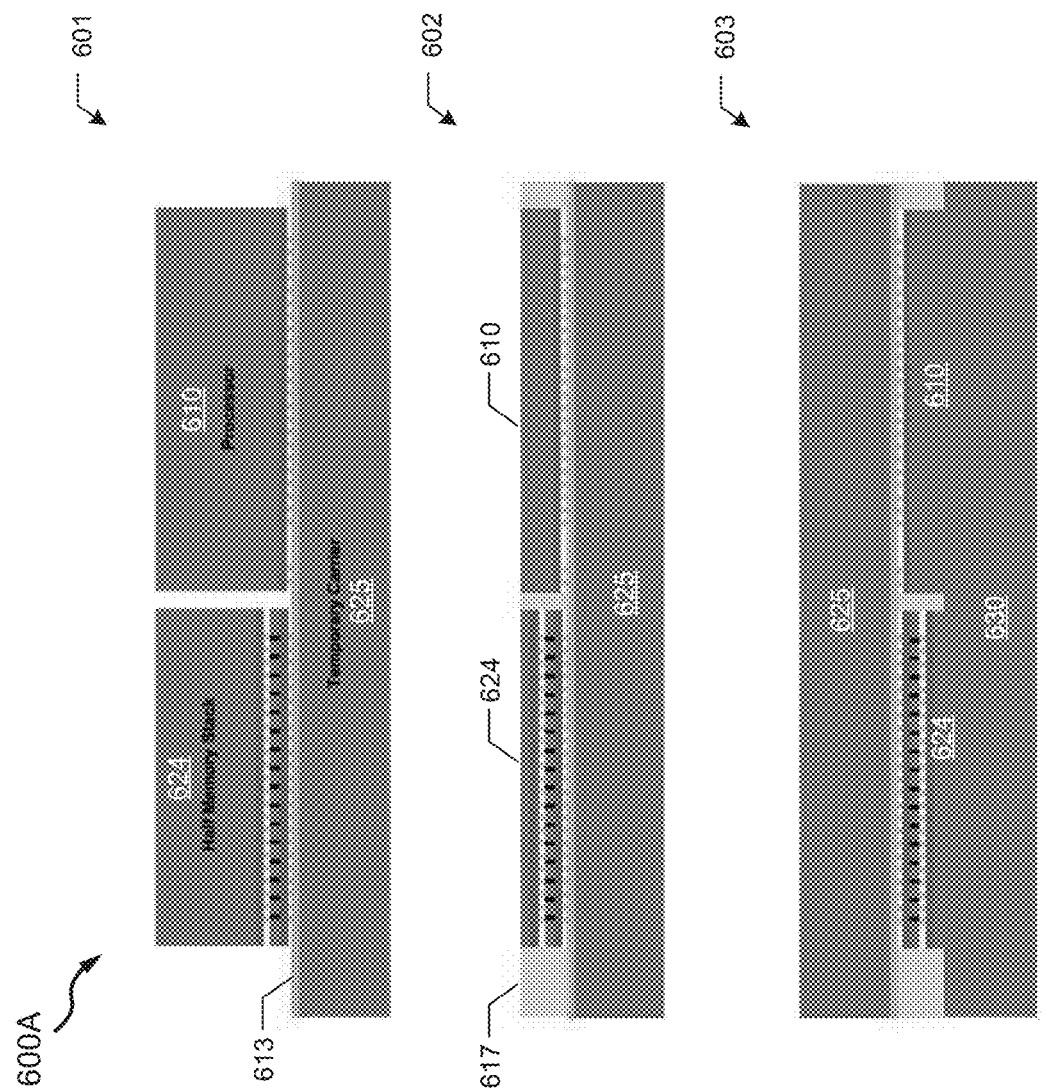
FIGS. 6A, 6B, 6C and 6D are diagrams illustrating an example of a process flow for fabricating an HCB DRAM stack with overlapping buffer in the middle of the stack, according to various aspects of the subject technology.

FIGS. 6A, 6B, 6C and 6D are diagrams illustrating an example of process flows 600A, 600B, 600C and 600D for fabricating an HCB DRAM stack with overlapping buffer in the middle of the stack, according to various aspects of the subject technology. Although the description herein is of placement of the overlapping copper-bonded buffer exactly in the middle of the stack ("half-stacks" on either side), for minimizing the worst-case path latency, in some implementations, the buffer could be anywhere within the stack. The process flow 600A only shows major steps and skips descriptions of process flow for individual layers, which are well known. In process step 601, a logic die (e.g., including a processor) 610 and a half memory stack 624 (e.g., the HCB DRAM stack) are bonded to a temporary carrier 625 using a temporary adhesive layer 613. In process step 602, fillers 617 (e.g., dielectric material) are deposited to fill gaps as shown in FIG. 6A. In process step 603, a silicon carrier wafer 630 is permanently bonded to the in-process product of the process step 602 and the result is flipped so that the temporary carrier 625 can be removed in a next process step 604 of FIG. 6B.

Figure 6B:
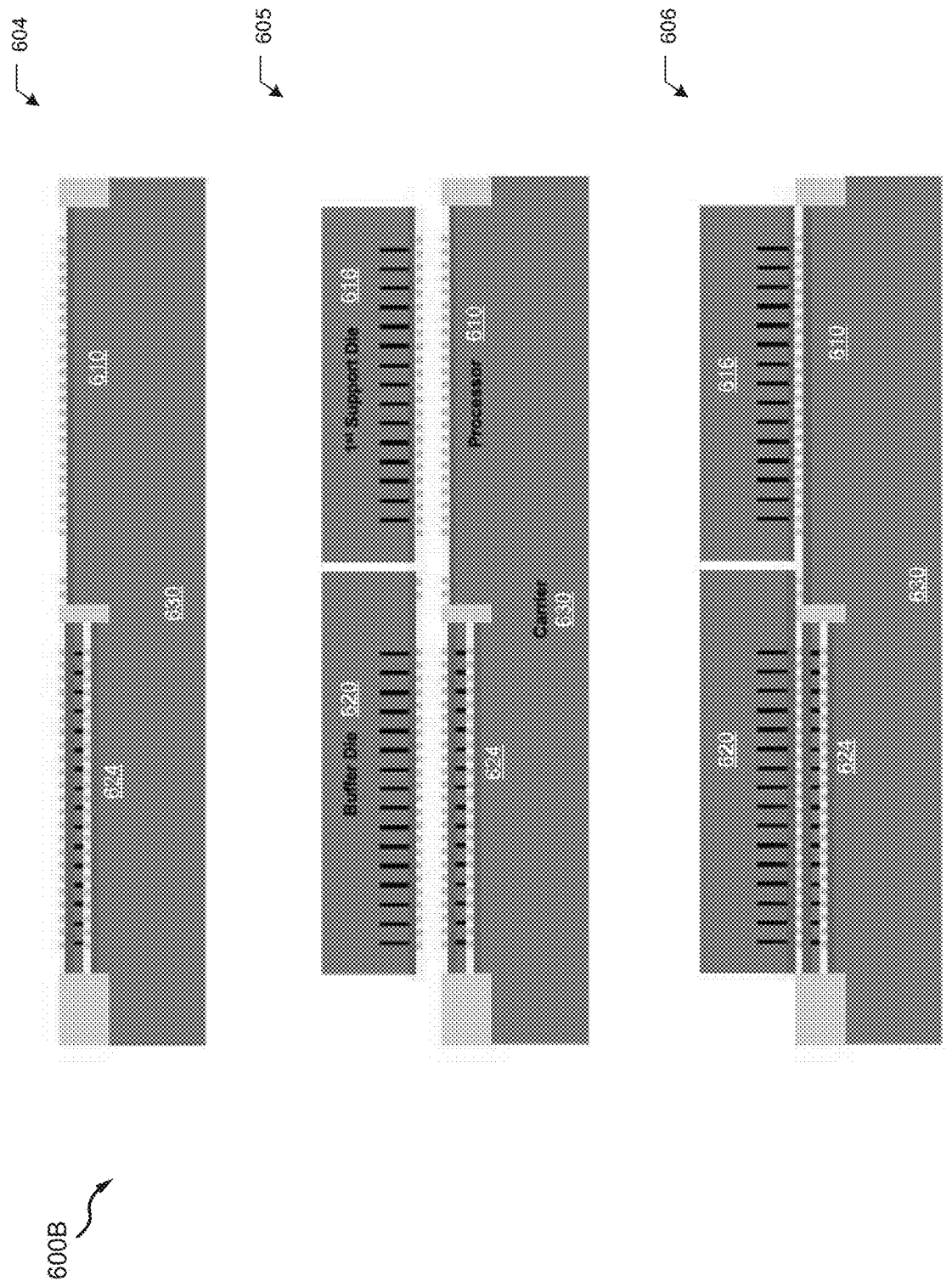

The process flow 600B of FIG. 6B is the continuation of the process flow 600A and includes process steps 604, 605 and 606. In process step 604, the temporary carrier 625 is removed so that the logic die 610 and the half memory stack die 624 and corresponding copper bonding layers are exposed. In process step 605, a buffer die 620, a support die 616 and corresponding active layers and copper bonding layers are prepared and face-to-face and die-to-wafer aligned with the in-process product of step 604. In process step 606, the buffer die 620 and support die 616 of process step 605 are copper bonded to the already aligned in-process product of step 604.

Figure 6C:
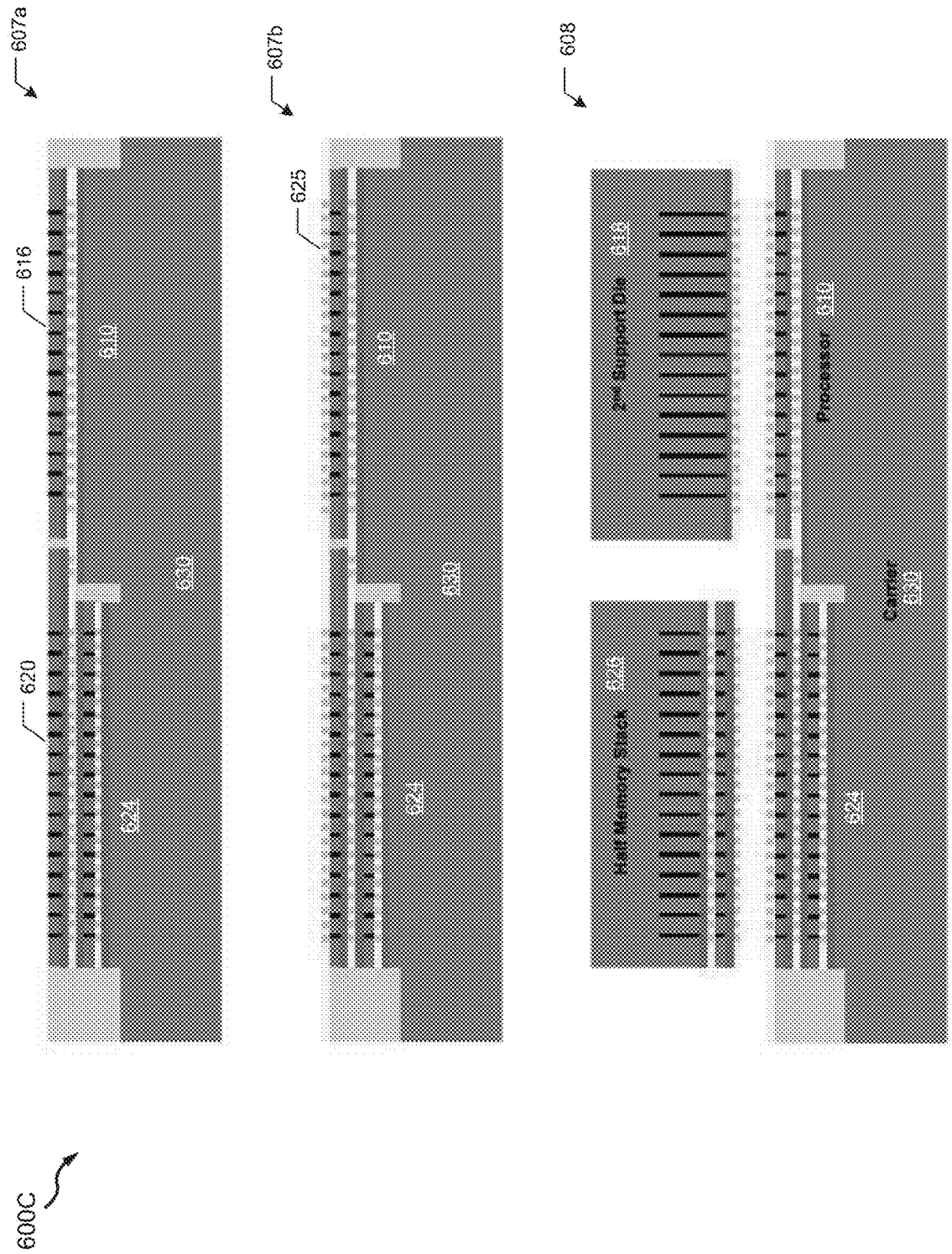

FIG. 6C is the continuation of the process flow 600B and includes process steps 607 and 608. In the process step 607a, the buffer die 620 and support die 616, which is are bonded to the in-process product of step 604, is are machined to a desired thickness, exposing the TSVs. The process step 607b shows preparation of the product of process step 607a for subsequent copper bonding by addition of patterned copper bonding layers 615 over the revealed TSVs. In the process step 608, a half memory stack 626 and a second support die 618 and corresponding active layers and copper bonding are prepared and face-to-face and die-to-wafer aligned with the in-process product of step 607.

Figure 6D:
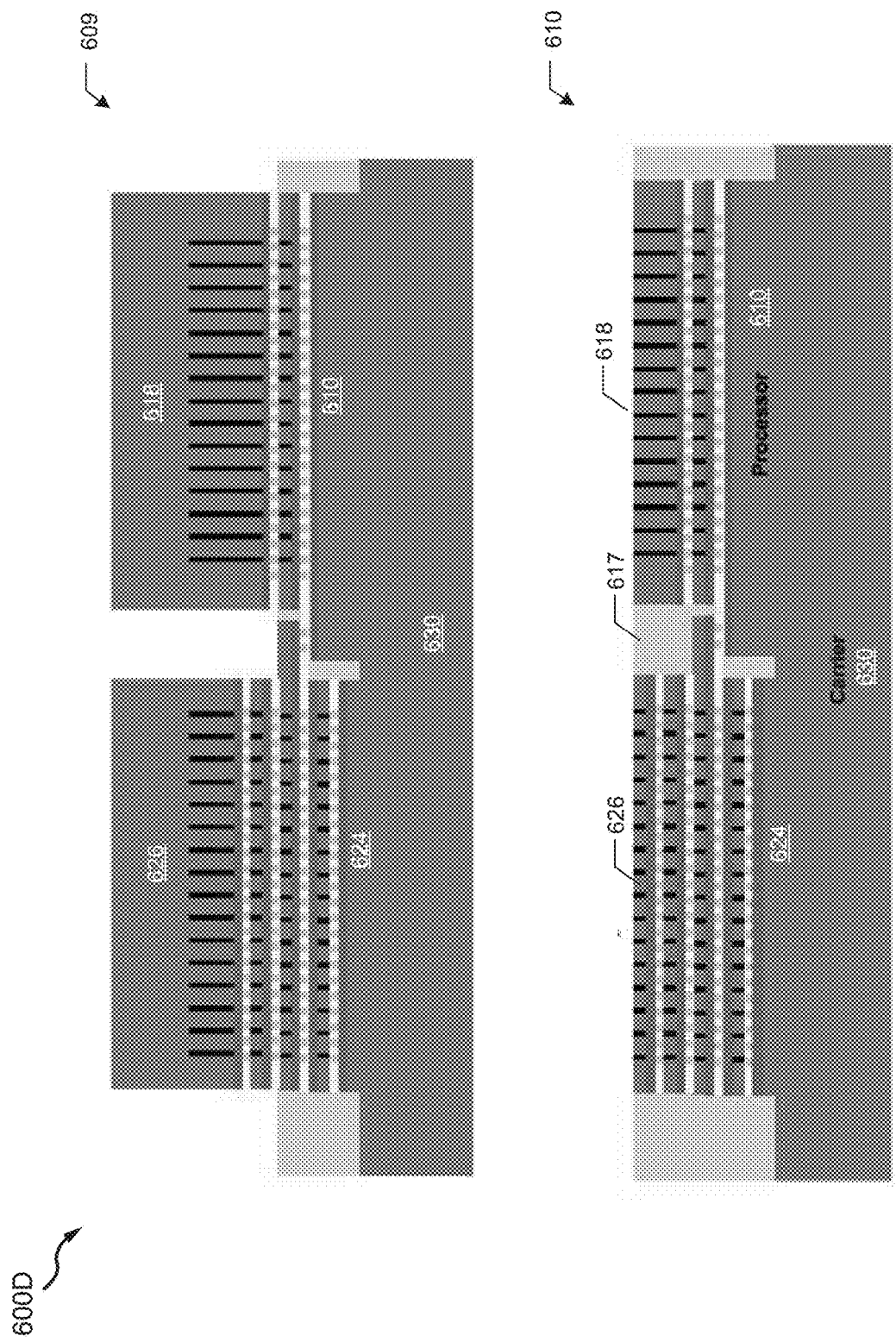

FIG. 6D is the continuation of the process flow 600C and includes process steps 609 and 610. In process steps 609, the half memory stack 626 and a second support die 618 are permanently bonded to the in-process product of step 607b. In process steps 610, the half memory stack 626 and the second support die 618, which are bonded to the in-process product of step 607b, are machined to a desired thickness, exposing the TSVs. In the process step 608, a half memory stack 626 and a second support die 618 and corresponding active layers and copper bonding are prepared and face-to-face and die-to-wafer aligned with the in-process product of step 607 to produce part of the memory system 200 of FIG. 2 (e.g., the logic die 202, memory stack 204, the buffer dies 220, the support die 208 and the silicon carrier 230).

Figure 7:
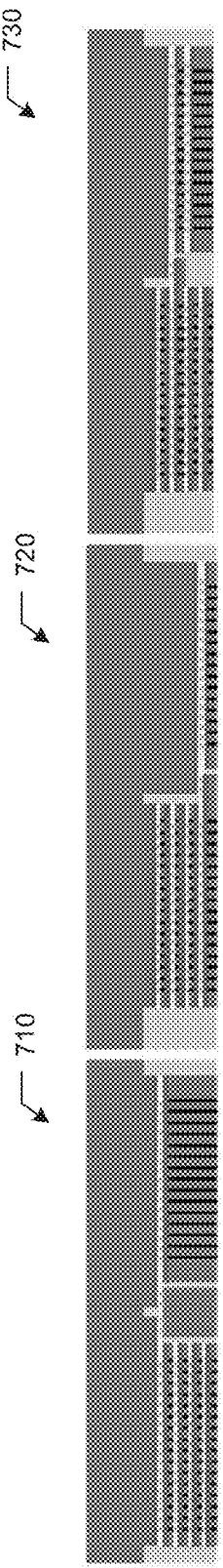
FIG. 7 is a diagram illustrating a comparison of HCB-connected DRAM stack configuration, according to various aspects of the subject technology.

FIG. 7 is diagram illustrating a comparison of HCB-connected DRAM stack configuration 710, 720 and 730, according to various aspects of the subject technology. The HCB-connected DRAM stack configuration 710, 720 and 730 are respectively the products of process flows of FIG. 4 (4A and 4B), FIG. 5 (5A, 5B and 5C) and FIG. 6 (6A, 6B, 6C and 6D) and are completed by addition of a copper redistribution layer with associated dielectrics and solder microbumps for connection to an interposer or other packages. In the orientation shown in these configurations, primary heat removal is through the top surface, which is the back surface of the silicon carrier. Note that the silicon carrier might include embedded microfluidic cooling.

Power and ground connections are provided for the DRAM stack (and to the logic die) through the microbump connections to the interposer or other packages (not shown) connected to the revealed TSV arrays at the bottom of surface as oriented in configurations of FIG. 7. Note that in the configuration 710 and 730, power and ground for the buffer die is fed through the DRAM stack, while in the configuration 720, the TSV arrays in the DRAM stack carry only power for the DRAM layers (as in a conventional HBM).

The external connections to the logic die need to be brought down to the same interposer/package plane used by the bottom TSV connections on the DRAM stack. As shown in the diagrams of FIG. 7, this could be done through one or more layers of support die stacked with the logic die, or it might be accomplished using through dielectric vias (not shown). Additional methods for making these external connections to the dummy die might include substitution of passive glass die with through-glass vias for the support die presently shown, or the use of three-dimensional spring structures formed on and released from an interposer surface. The three configurations 710, 720 and 730 provide different depths available for the stacking of support die, with the bridge-die configurations 710 providing the most depth, the buffer-on-bottom configuration 720 providing the least, and the buffer-in-middle configuration 730 the providing a medium depth. The buffer-in-middle configuration 730 has a potential benefit in that the maximum vertical distance from any DRAM layer to the buffer is cut in half compared to the other configurations, possibly improving efficiency or reducing latency.

Figure 8:
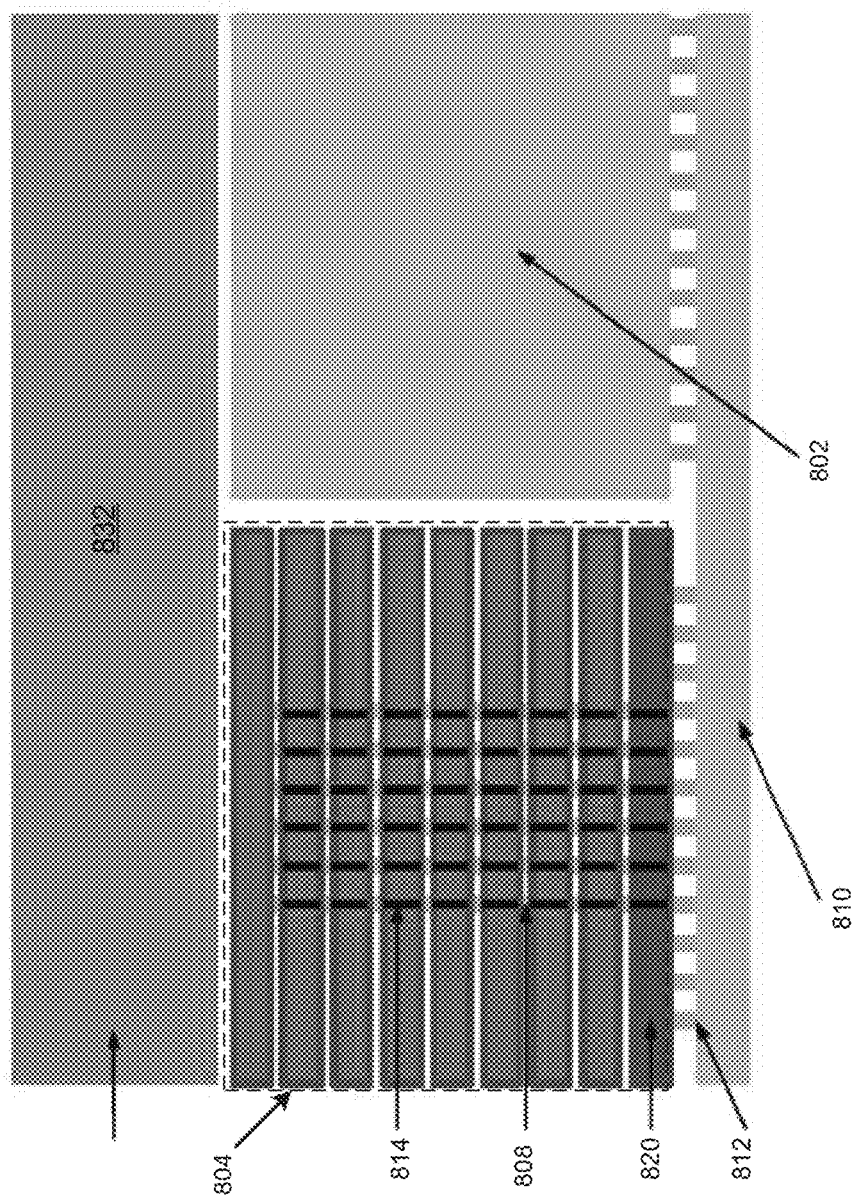
FIG. 8 is a schematic diagram illustrating an example of a conventional memory stack.

FIG. 8 is a schematic diagram illustrating an example of a conventional memory stack 800. The conventional memory system 800 includes the HBM stack 804 (e.g., DRAM stack), a logic die 802 (e.g., including a data-processing circuitry), an interposer 810, a buffer die 820 and a heat sink 832. The HBM stack 804 includes a number of memory dies that are interconnected via solder microbump interconnections 808. The HBM stack 804 is connected to buffer die 820 via solder microbumps 808, the buffer die 820 is connected face down to interposer 810 through solder bumps 812, power-delivery network (PDN) for logic die 802 is achieved through TSV and solder bumps and communication between the logic die 802 and the HBM stack 804 is provided through solder bumps and interposer. In the implementation of the subject technology (e.g., 710 of FIG. 7) the buffer die connected with back surface to silicon carrier, PDN for both memory die and buffer die is through TSV and copper-to-copper bonds, and communication to processor is provided through copper-bonded bridge, as described above with respect to FIG. 1.

The subject technology has a number of applications, for example, the application in high-performance logic systems, such as processing units or networking equipment typically installed in data centers. Systems requiring the memory capacity of such memory stacks typically consume too much power and produce too much heat for mobile applications.

Those of skill in the art would appreciate that the various illustrative blocks, modules, elements, components, memory systems, and algorithms described herein may be implemented as electronic hardware, computer software, or combinations of both. To illustrate this interchangeability of hardware and software, various illustrative blocks, modules, elements, components, memory systems, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that any specific order or hierarchy of blocks in the processes disclosed is an illustration of example approaches. Based upon design preferences, it is understood that the specific order or hierarchy of blocks in the processes may be rearranged, or that all illustrated blocks should be performed. Any of the blocks may be simultaneously performed. In one or more implementations, multi-tasking and parallel processing may be advantageous. Moreover, the separation of various system components in the embodiments described above should not be understood as requiring such separation in all embodiments, and it should be understood that the described program components and systems could generally be integrated together in a single software product or packaged into multiple software products.

As used in this specification and any claims of this application, the terms "base station," "receiver," "computer," "server," "processor," and "memory" all refer to electronic or other technological devices. These terms exclude people or groups of people. For the purposes of the specification, the term "display" or "displaying" means displaying on an electronic device.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" and "at least one of A, B, or C" each refer to only A, only B, or only C; any combination of A, B, and C; and/or at least one of each of A, B, and C.

The predicate words "configured to," "operable to," and "programmed to" do not imply any particular tangible or intangible modification of a subject but rather are intended to be used interchangeably. In one or more implementations, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

Phrases such as "an aspect," "the aspect," "another aspect," "some aspects," "one or more aspects," "an implementation," "the implementation," "another implementation," "some implementations," "one or more implementations," "an embodiment," "the embodiment," "another embodiment," "some embodiments," "one or more embodiments," "a configuration," "the configuration," "another configuration," "some configurations," "one or more configurations," "the subject technology," "the disclosure," "the present disclosure," and other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as "an aspect" or "some aspects" may refer to one or more aspects and vice versa, and this applies similarly to other foregoing phrases.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skilled in the art are expressly incorporated herein by reference and are intended to be encompassed by the claims. Moreover, nothing disclosed herein is intended to be dedicated to the public, regardless of whether such disclosure is explicitly recited in the claims. No claim element is to be construed under the provisions of 35 U.S.C. § 112(f) unless the element is expressly recited using the phrase "means for" or, in the case of a memory system claim, the element is recited using the phrase "step for."

The previous description is provided to enable any person skilled in the art to practice the various aspects described herein. Various modifications to these aspects would be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A memory system comprising:
   a memory stack including a plurality of memory dies interconnected via copper bonding;
   a logic die coupled to the memory stack via the copper bonding;
   a buffer die extended to provide the copper bonding between the logic die and the memory stack;
   a silicon carrier layer bonded to the memory stack and the logic die; and
   an interposer layer coupled to the logic die and the memory stack.

2. The memory system of claim 1, wherein the buffer dies is located in a middle position of the memory stack.

3. The memory system of claim 1, wherein the buffer die is located in a bottom position of the memory stack.

4. The memory system of claim 1, further comprising a passive bridge die located between the memory stack and the logic die.

5. The memory system of claim 4, wherein the passive bridge die is conductively coupled to the logic die and the buffer die via copper bonding, and wherein the buffer dies is connected to the memory stack via copper bonding.

6. The memory system of claim 1, wherein the logic die includes one or more data-processing circuitry.

7. The memory system of claim 1, wherein the memory stack comprises hybrid-copper bonded (HCB) memory including dynamic random-access memory (DRAM).

8. The memory system of claim 1, wherein the interposer layer is coupled to the logic die via one or more support dies including through-silicon vias (TSVs) coupled to one another and to the logic die via copper bonding.

9. The memory system of claim 1, further comprising a heatsink layer bonded to the silicon carrier layer.

10. The memory system of claim 1, wherein the buffer die overlaps the logic die.

11. A method comprising:
    fabricating a memory stack by interconnecting a plurality of memory dies via copper bonding;
    coupling a logic die to the memory stack via the copper bonding;
    disposing an extended buffer die to provide the copper bonding between the logic die and the memory stack;
    bonding a silicon carrier layer to the memory stack and the logic die; and
    coupling an interposer layer to the logic die and the memory stack.

12. The method of claim 11, further comprising disposing the extended buffer die in a bottom position of the memory stack.

13. The method of claim 11, further comprising disposing the extended buffer die in a middle position of the memory stack.

14. The method of claim 11, further comprising:
    disposing a passive bridge die between the memory stack and the logic die;
    conductively coupling the passive bridge die to the logic die and the extended buffer die via copper bonding; and
    connecting the extended buffer dies to the memory stack via the copper bonding.

15. The method of claim 11, further comprising:
    coupling the interposer layer to the logic die via one or more support dies including through-silicon vias (TSVs) and
    coupling the one or more support dies to one another and to the logic die via copper bonding.

16. The method of claim 11, further comprising bonding a heatsink layer to the silicon carrier layer.

17. The method of claim 11, wherein fabricating the memory stack comprises fabricating a hybrid-copper bonded (HCB) memory including dynamic random-access memory (DRAM), and wherein coupling the logic die comprises coupling data-processing circuitry.

18. The method of claim 11, wherein coupling the interposer layer to the logic die and the memory stack comprises coupling via copper bonding.

19. A system comprising:
    a memory comprises a memory stack including a plurality of memory dies interconnected via copper bonding;
    a processor coupled to the memory, the processor implemented on a logic die coupled to the memory stack via a copper bonding;
    an extended buffer die configured to provide the copper bonding between the logic die and the memory stack, the extended buffer die located in one of a middle position or a bottom position of the memory stack; and
    an interposer layer is coupled to the logic die via one or more support dies including through-silicon vias (TSVs) coupled to one another and to the logic die via the copper bonding, wherein the interposer layer is coupled to the memory stack through solder bumps.

20. The system of claim 19, wherein the solder bumps comprise conductive solder bumps.

* * * * *